United States Patent [19]
Jeng et al.

[11] Patent Number: 5,792,687
[45] Date of Patent: Aug. 11, 1998

[54] METHOD FOR FABRICATING HIGH DENSITY INTEGRATED CIRCUITS USING OXIDE AND POLYSILICON SPACERS

[75] Inventors: Erik S. Jeng, Taipei; Ing-Ruey Liaw, Hsinchu, both of Taiwan

[73] Assignee: Vanguard International Semiconductor Corporation, Hsin-Chu, Taiwan

[21] Appl. No.: 691,289

[22] Filed: Aug. 1, 1996

[51] Int. Cl.[6] ............................................. H01L 21/8242
[52] U.S. Cl. ............................................. 438/253; 438/255
[58] Field of Search ................................ 438/238, 239, 438/253, 255, 396, 398; 257/296, 306, 309, 310

[56] References Cited

U.S. PATENT DOCUMENTS

| | | | |
|---|---|---|---|
| 3,970,386 | 7/1976 | Kooi | 148/187 |
| 5,346,844 | 9/1994 | Cho et al. | 438/396 |
| 5,389,566 | 2/1995 | Lage | 437/52 |
| 5,451,539 | 9/1995 | Ryou | 437/60 |
| 5,631,185 | 5/1997 | Kim et al. | 438/397 |

*Primary Examiner*—Joni Chang
*Attorney, Agent, or Firm*—George O. Saile; Stephen B. Ackerman; William J. Stoffel

[57] ABSTRACT

The preset invention provides a method of manufacturing miniature interconnects and capacitors for semiconductor memory devices. The method uses a configuration of two sets of spacers to form self aligned source/bit line contacts and capacitor storage electrodes. First spacers are formed on the sidewalls of an interlevel dielectric layer. The first spacers define the source/bit line contacts holes. Later, the second spacers are formed the sidewalls of the bit lines. The second spacers define the capacitor storage electrodes. The self-aligning process, which uses the two set of spacers, allows a wide processing overlay window for contact etching to form the contact holes and permits small contact holes with high aspect ratios. The method reduces the masking steps by defining both the source and drain contacts in the same masking step.

23 Claims, 6 Drawing Sheets

METHOD FOR FABRICATING HIGH DENSITY INTEGRATED CIRCUITS USING OXIDE AND POLYSILICON SPACERS

BACKGROUND OF INVENTION

1) Field of the Invention

This invention relates generally to the fabrication of high density semiconductor circuits and more particularly to a method for fabricating capacitors and bit line contacts for high density integrated circuits and DRAM devices.

2) Description of the Prior Art

Semiconductor technologies have dramatically increased the circuit density on a chip. The miniaturized devices built in and on a semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitations due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. Metallization in contact with the semiconductor substrate is called contact metallization. In MOS devices, polysilicon film has been the form of metallization used for gate and interconnection of MOS devices. The inability to further miniaturize the contact metallization (i.e., first level interconnections) is a major obstacle in the miniaturization of DRAMs and other devices, such as MOS and Bipolar devices. Also, the decrease in cell capacitance caused by reduced memory cell area is a serious obstacle to increasing packing density in dynamic random access memories (DRAMs). Thus, the problems forming smaller first level contacts (i.e., first level interconnections) and the problems of decreased cell capacitance must be solved to achieve higher packing density in a semiconductor memory devices.

Other practitioners have worked to miniature semiconductor elements. U.S. Pat. No. 5,451,539 (Ryou) shows a method of forming an crown shaped capacitor. However, Ryou does not address the problem of forming small bit line interconnects. U.S. Pat. No. 5,389,566 (Lage) shows a method for forming a ferromagnetic memory device using two overlapping sets of spacers. However, the overlapping spacer method is complex and does not address the problems of forming small bit lines and capacitors. Moreover, in general, many of the other prior art methods require substantially more processing steps or/and planar structures which make the manufacturing process more complex and costly. Also, other processes rely on etching to a predetermined etch depth which can be quite difficult to control in a manufacturing environment. For example, during plasma etching outgassing, leaks, back streaming from pumps, and loading effects, to name a few, can change the chemistry of the etching environment in the process chamber, thereby making a calibrated etch time approach difficult to control. Therefore, it is very desirable to develop processes that are as simple as possible and also provide methods that do not require etches with critical depths.

There is a challenge to develop methods of manufacturing these interconnects and conductors that minimize the manufacturing costs and maximize the device yields. In particular, there is a challenge to develop a method which minimizes the number of photoresist masking operations and to provide maximum process overlay tolerance to maximize product yields. Typically, in DRAM fabrication, two mask/etch steps are performed to form the conductor connection to the bit line and the node contact. Moreover, the conductor contact and node contacts are not self aligned which limits their miniaturization. Furthermore, contact holes through thick insulation layer create high aspect ratios (greater than 3) which make the contact etch processes difficult and etch defects reduce yields. There is also a challenge to develop an interconnection process in which the interconnect size is not limited in minimum size by the photolithographic techniques.

SUMMARY OF THE INVENTION

It is an object of the present invention to provide a method for fabricating an integrated circuit having first level interconnects (contacts) that overcomes the size limitations of photographic techniques and that reduces the number of masking steps.

It is an object of the present invention to provide a method for fabricating an integrate circuit having high density contact hole formations and interconnections.

It is another object of the present invention to provide a method for fabricating an integrated circuit having interconnects that increase the bit line contact and capacitor node contact overlay process window using a first spacer of polysilicon on an interlevel dielectric layer.

It is yet another object of the present invention to provide a method for fabricating a dynamic random access memory (DRAM) device having capacitor defined by a second spacers composed of silicon oxide, which is low cost, simple to manufacture, and has large process overlay windows.

To accomplish the above objectives, the present invention provides a method of manufacturing semiconductor devices having high density first level interconnects (to the nodes and bit lines) and of forming a stacked capacitor for a DRAM cell. These goals are achieved by the process which: (1) forms self aligned node and bitline contacts using first sidewall spacers on the interlevel dielectric (ILD) layer and (2) defines a capacitor using a second sidewall spacers formed on bit lines.

Briefly, the method of fabricating interconnects on a semiconductor substrate having a device area and spaced isolation regions formed therein, comprising the steps of providing a substrate having transistors in the active areas, the transistors comprising a source region, a drain region, and a gate electrode; forming a conformal oxide layer over the resultant surface; depositing an interlevel dielectric layer over the conformal oxide layer; forming a first polysilicon layer over the inter level dielectric layer; masking and etching the first polysilicon layer and the inter level dielectric layer forming first openings over the source and drain regions, the first openings defined by first sidewalls of the first polysilicon layer and the inter level dielectric layer; forming first sidewall spacers on the first sidewalls; forming node contact holes and bitline contact holes by etching the interlevel dielectric layer using the first polysilicon layer and the first sidewall spacers as a mask, the node contact holes exposing the source regions and the bitline contact holes exposing the drain regions; filling the node contact holes with node plugs and filling the bitline contact holes with bitline plugs; forming a polycide layer over the interlevel dielectric layer, the bitline plugs and the node plugs; forming an oxide layer over the polycide layer; patterning and etching the oxide layer, the polycide layer, the polysilicon layer, the first sidewall spacers, and portions of the node plugs forming capacitor openings and bit lines, the capacitor opening defined by bit lines, the oxide layer, the polycide layer, the polysilicon layer; forming second sidewall spacers on the second sidewalls; and forming an electrode plate filling the first openings and forming an electrical contact to the node plugs thereby forming an interconnect to said source regions.

The process of the current invention has numerous advantages over the prior art. The inventive self-aligning process uses the two sets of sidewall spacers that allow a wide processing window for contact etching to form the contact hole and the storage electrode of the capacitor. The bitline and source node interconnects are defined by and self aligned to a first set of spacers formed on an interlevel dielectric layer. These first spacers allow small contact holes to be formed with aspect ratio greater than 3. The second set of sidewall spacers produce a self aligned capacitor storage electrode which maximizes capacitance, simplifies the process, and increases process tolerances.

DETAILED DESCRIPTION OF THE PREFERRED EMBODIMENTS

The present invention will be described in detail with reference to the accompanying drawings. The present invention provides a method of forming miniaturized first level interconnects (contacts) and capacitors. The interconnects electrically connect the substrate level devices, (i.e., sources, drains) to first level devices (i.e., bit lines and capacitors). The interconnects are self aligning and are formed using the first spacers. The capacitor is defined by a second set of polysilicon sidewall spacers. Also, the method can be used to formed a memory cell having a capacitor which has small dimensions, high capacitance and is simple to manufacture. First, the processes for forming the field oxide (FOX) and the field effect transistor structure as presently practiced in manufacturing DRAM cells are only briefly described in order to better understand the current invention. Second, the novel method uses two sets of spacers to define the interconnects and storage electrodes will be described in detail. Also, the term substrate surface is meant to include the top surfaces of layers or structures formed on the semiconductor substrate.

Figure 1:
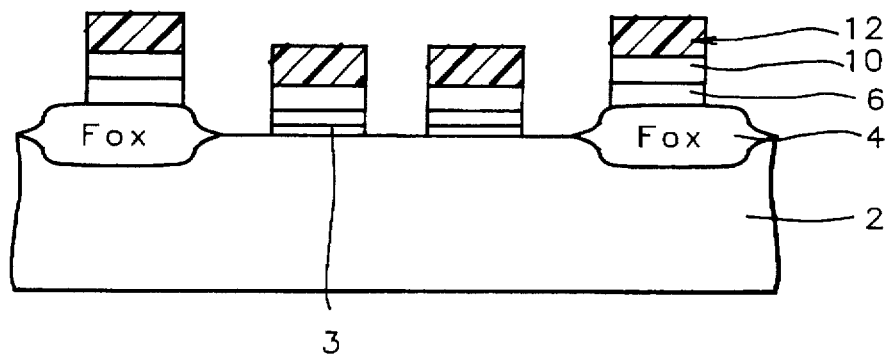
FIGS. 1 through 11 are cross sectional views for illustrating the method for manufacturing a DRAM device having interconnects and capacitors defined by two sets of spacers according to the present invention.

As shown in FIG. 1, the method begins by providing a substrate having isolation regions 4, such as field oxide layers 4, surrounding device areas (i.e., active regions) and having FET devices formed thereon. The preferred substrate is composed of a P-type single crystal silicon having a (100) crystallographic orientation.

A relatively thick field oxide (FOX) 4 is formed around the active device areas to electrically isolate these areas. One method of forming these FOX regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The field oxide preferably is formed by masking the active device areas with a thick silicon oxide (pad oxide) and a thicker silicon nitride barrier layer which forms an oxidation barrier. The silicon substrate is then oxidized in an oxidizing ambient to form the field oxide. The preferred thickness of the field oxide being in the range of about 3000 to 5000 Å.

A semiconductor FET device is then formed in the active device area after removing the silicon nitride barrier layer and the pad oxide with a conventional wet etch. The most commonly used device for a dynamic random access memory (DRAM) is MOSFET. This device is formed by first thermally oxidizing the active device area to form a thin gate oxide layer 3. The preferred thickness of the field oxide being from about 70 to 90 Å.

As shown in FIG. 1, a first conductive layer 6 10 is formed over said gate oxide layer 3. The first conductive layer 6 10 is preferably composed of a bottom polysilicon layer 6 (preferably doped with impurities) and an upper polycide layer 10, such as a tungsten silicide layer. The bottom polysilicon layer 6 preferably has a thickness in the range of between about 500 and 1500 Å. The upper polycide silicide layer 10 preferably has a thickness in the range of between about 500 and 1500 Å.

Next, a gate dielectric layer 12 is formed over the conductive layer 6 10. The gate dielectric is preferably formed of silicon oxide or silicon nitride and is more preferably formed of $SiO_2$. The gate dielectric layer preferably has a thickness in the range of between about 500 and 2000 Å. Layer 12 is composed of silicon oxide preferably formed by a process using Tetraethylorthosilicate (TEOS).

The TEOS oxide has a thermal expansion coefficient of expansion close to that of the gate lines thereby reducing interface stress. The thermal expansion of TEOS oxide 12 is much closer to the thermal expansion of the gate line than silicon nitride (SiN).

Next, photolithographic and etching techniques are used to pattern the gate oxide layer 03, the conductive layer 06 10 and the gate dielectric layer 12, to form spaced gate electrodes and conductive structures. Conductive structures formed on the field oxide regions can act as a word lines. Gate electrodes are formed on the substrate surface and can be part of the transistor in a DRAM or other devices. The patterning of the gate electrodes and conductive structures is performed by forming a mask on the gate dielectric layer 12 and etching the underlying layers.

The lightly doped source/drain (not shown) of the N-channel MOSFET are preferably formed next, usually by implanting an N-type atomic species such as arsenic or phosphorus through the spaces between the gate electrodes 3 6 10 12 thereby forming lightly doped source and drain. For example, a typical implant might consist of phosphorus P31 at a dose of between about 1E13 to 1E14 atoms/cm$^2$ and at an energy between about 30 to 80 Kev.

Figure 2:
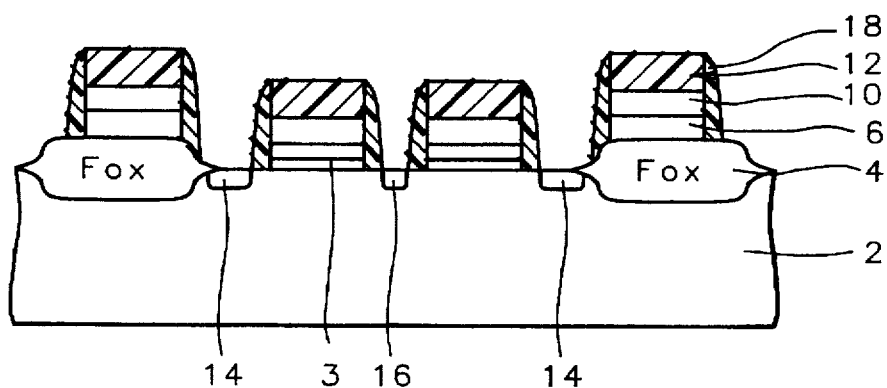

Referring to FIG. 2, gate sidewall spacers (i.e., first isolation spacers) 18 are formed on the gate electrode 3 6 10 12 sidewalls. The first isolation spacers 18 are preferable formed of silicon oxide using a TEOS process. The gate sidewall spacers 18 preferably have a thickness in the range of between about 200 and 1000 Å and more preferably about 500 Å. The distance between the gate electrodes is preferably in the range of between about 0.25 and 0.4 µm and the distance between the first isolation spacers is preferably in the range of between about 0.2 and 0.35 µm.

Still referring to FIG. 2, the source (node)/drain (bitline) regions 14, 16 of the MOSFET are now implanted between the gate spacers 18 and gate electrodes 3 6 10 12 with a N type atomic species, for example, arsenic (As75), to complete the highly doped source/drain 14 16 (ie., the source is the node contact 14 and the drain is the bitline 16). The implantation is usually done through a thin layer of silicon oxide of about 200 to 300 Å in thickness to minimize implant channeling and to protect against contamination by metals and other impurities. A typical implantation dose being between 2E15 to 1E16 atoms/cm$^2$ and an energy of between about 20 to 70 Kev.

Figure 3:
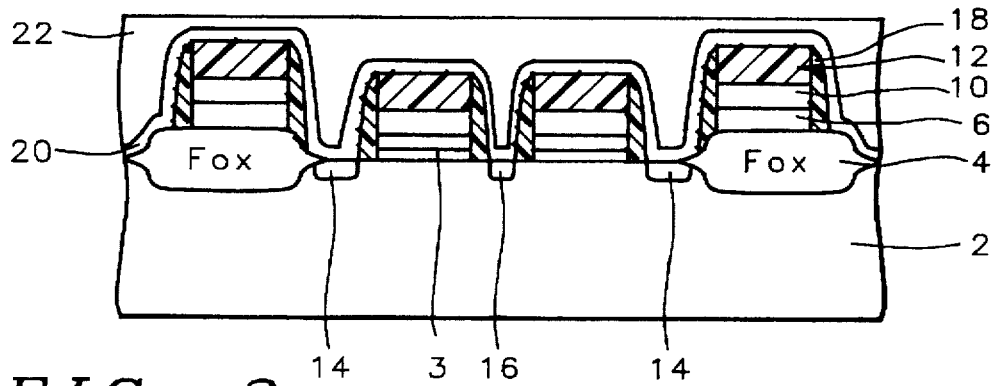

Referring to FIG. 3, a conformal oxide layer 20 (i.e., first insulating layer) is formed over the resultant surface. The conformal oxide layer preferably has a thickness in the range of between about 500 and 5000 Å and more preferably about 1000 Å.

Still referring to FIG. 3, an interlevel dielectric (ILD) layer 22 is deposited over the conformal oxide layer 20. The interlevel dielectric layer 22 is then preferably etched back to planarized the surface. The interlevel dielectric layer 22 is preferably formed of borophosphosilicate glass. The interlevel dielectric layer 22 preferably has an initial thickness in the range of between about 3000 and 10,000 Å and more preferably about 4500 Å. After etch back, the interlevel dielectric layer 22, preferably has a thickness in the range of between about 0 and 3500 Å and more preferably about 2000 Å. Also, the conformal oxide layer 22 can be optional and may be omitted, especially when layer 20 has a thickness more than about 3000 Å.

Figure 4:
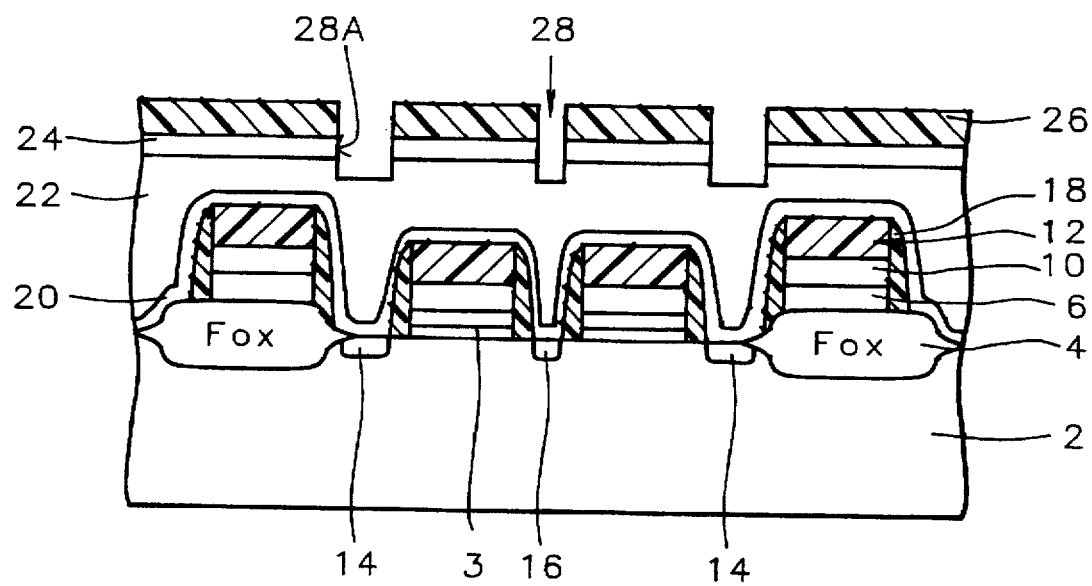

Turning to FIG. 4, a first polysilicon layer 24 is formed over the interlevel dielectric (ILD) layer 22. The poly layer is preferably doped by an insitu doping process or ion implant. The first polysilicon layer 24 preferably has a thickness in the range of between about 1000 and 3000 Å and an impurity concentration preferably in the range of between about 1E19 and 1E21 atoms/cm$^3$.

Still referring to FIG. 4, a first opening 28 is formed that is defined by first sidewalls 28A by masking (i.e., photo resist layer 26) and selectively etching the first polysilicon layer 24. The first opening is formed over at least the source and drain areas. The etch is preferably an etch using $Cl_2/O_2$ or $SF_6/CHF_3/HBr$ etchants and is preferably a timed etch. The first opening 28 defined by first sidewalls 28A preferably has a width in the range of between about 0.25 and 0.4 µm and more preferably about 0.35 µm.

Figure 5:
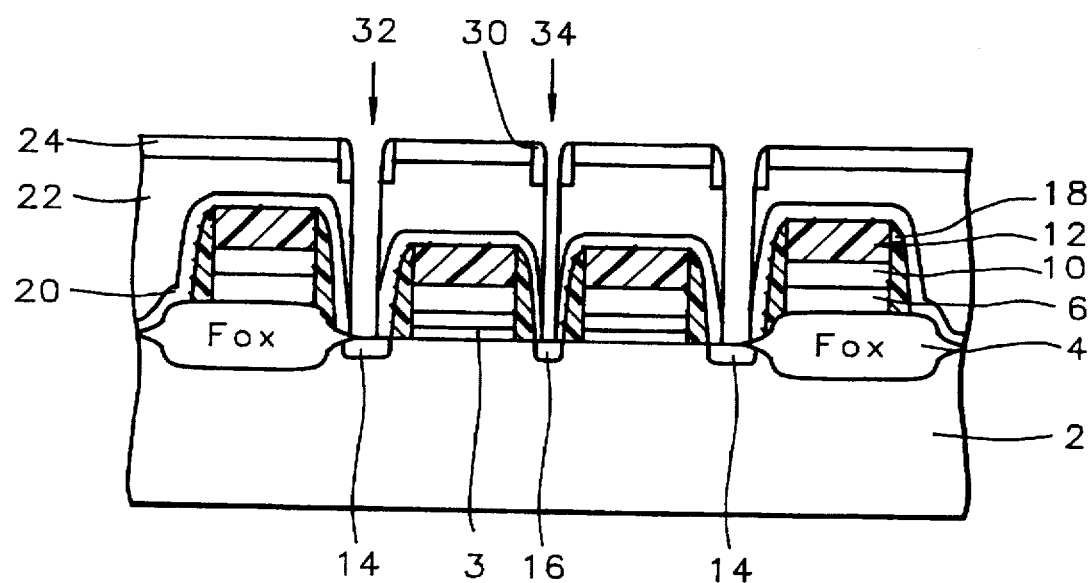

As shown in FIG. 5, first sidewall spacers 30 are formed on the first sidewalls 28A. First sidewall spacers 30 can be formed of polysilicon, silicon oxide or silicon nitride and are more preferably formed of polysilicon. It is important to note that a spacer 30 formed of polysilicon is superior to a spacer formed of silicon nitride (SiN) because hard mask etches have a higher etch selectivity between polysilicon and oxide compared to SiN and oxide. The first sidewall spacers 30 comprising polysilicon can be formed by depositing a conformal polysilicon layer over the resultant surface and anisotropically etching the conformal polysilicon layer to form the first sidewall spacers 30. The conformal layer is preferably doped with impurities by either ion implantation or in situ doping. The first sidewall spacers 30 preferably have a thickness in the range of between about 500 and 1000 Å. The first sidewall spacers 30 preferably have an impurity doping in the range of between about 1E13 and 1E21 atoms/cm$^3$.

As shown in FIG. 5, node contact holes 32 and bitline contact holes 34 are formed by etching the interlevel dielectric layer 22 using the first polysilicon layer 24 and the first sidewall spacers 30 as a mask. The preferred etch is an anisotropic etch using $CF_4/CHF_3$ chemicals. The etch selectively etches oxide over polysilicon with a ratio in the range of between about 2:1 and 30:1 (oxide:polysilicon). The node contact holes 32 exposes the source regions 14 and the bitline contact holes 34 exposing the drain regions 16.

By using the first spacers, the present invention allows for a wider overlay process window (compared to a photo defined contact holes) and thereby avoids short circuits.

The first spacers also allow the contact holes to be formed smaller than that possible using a conventional photo masking/etch process. A small, (i.e., reduced size) contact can be made by spacers beyond the limitations of photolithography. The reduced hole size is equal to the original photolithographic size (diameter) minus the width of spacers. And the width of spacers can be defined by the deposition thickness of spacer material which can be controlled in the scale of nanometer (nm). That is, the width of the spacers can be controlled much tighter than the width of the photolithographic holes. For example, the overlay process tolerance for the present invention between the gate electrode mask and the bitline contact mask is preferably in the range of between about 0.05 and 0.15 µm. The compares with the conventional overlay tolerances in the range of between about 0 and 0.05 µm. For an arrangement of line width of 0.4 µm and a line spacing of 0.5 µm, the 0.4 µm diameter contact holes allow only 0.05 µm misalignment tolerance on each side of gate lines. Using a spacer with a width of 0.1 µm 0.2 µm diameter holes, (i.e., reduced contact) can be formed. This can gain another 0.1 µm overlay tolerance on each side, i.e., total 0.15 µm of photo tolerance.

Figure 6:
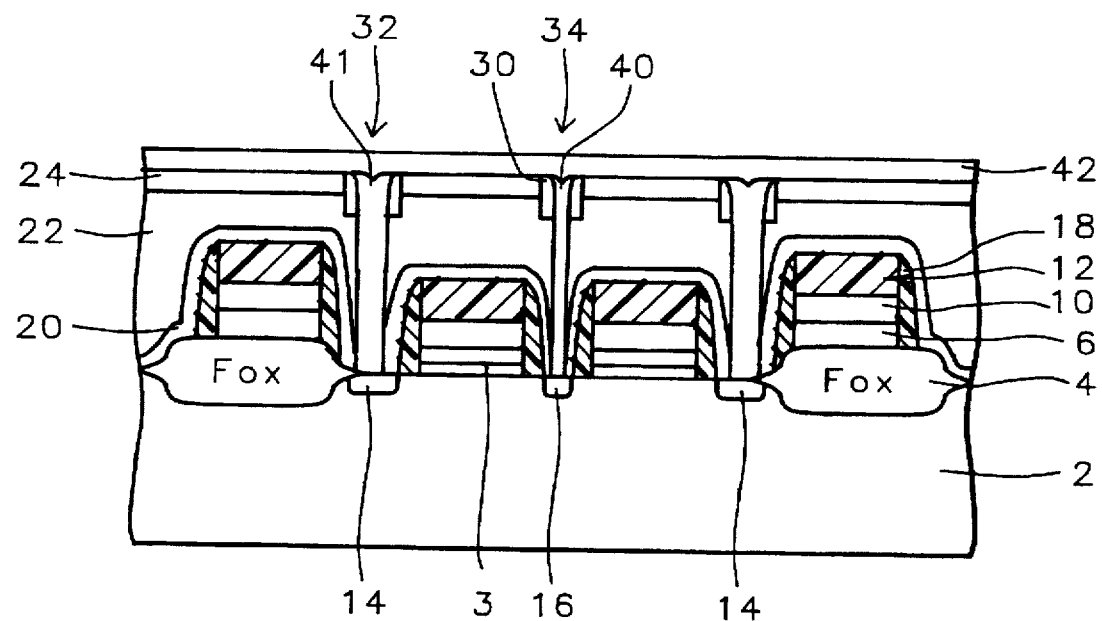

Turning to FIG. 6, the node contact holes 32 are filled with node plugs 41 and the bitline contact holes 34 are filled with bitline plugs 40. To accomplish this, preferably a polysilicon layer, implanted with impurities, is formed over the resultant surface and fills the node contact holes 32 and the bitline contact holes 34. Next, the layer is isotropically etched leaving a planarized polysilicon layer and the node plugs 41 and bitline plugs 40 in the contact holes 32, 34. The node and bitline plugs 41, 40 are preferably formed of polysilicon, polycide, or tungsten silicide (WSix).

Subsequently, a polycide (e.g., tungsten silicide) layer 42 is formed over the interlevel dielectric layer 22, the bitline plugs 40 and the node plugs 41. The tungsten silicide layer 42 preferably has a thickness in the range of between about 500 and 1500 Å.

Figure 7:
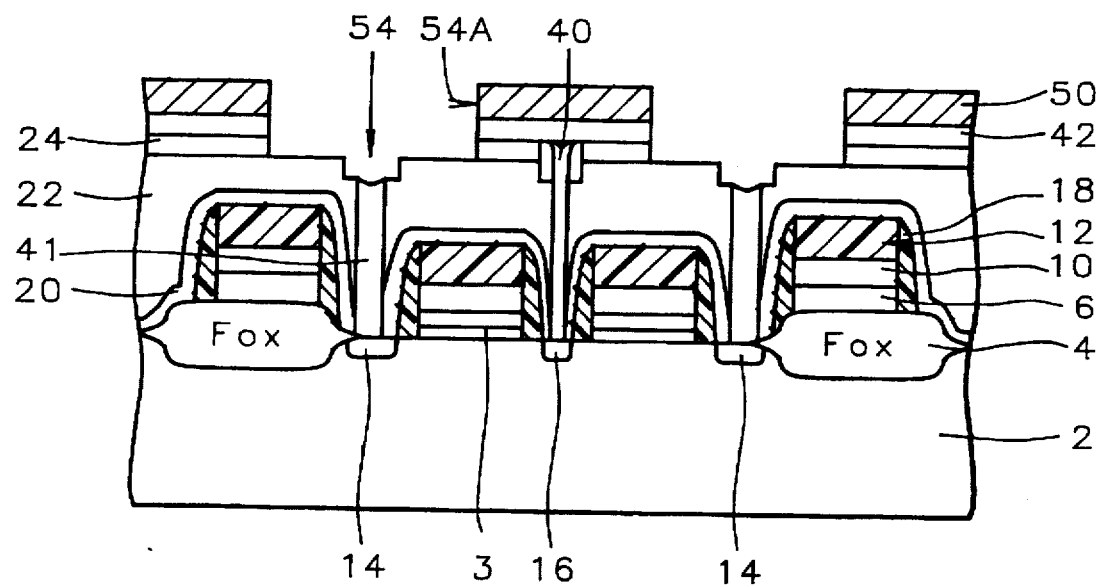

Turning to FIG. 7, an oxide layer 50 (e.g., first oxide layer) is then formed over the polycide layer 42. Layer 50 is preferably formed of oxide or silicon nitride (LPCVD SiN) and is more preferably formed of silicon oxide. The oxide layer 50 is preferably formed using a TEOS process. The oxide layer 50 preferably has a thickness in the range of between about 500 and 2000 Å and more preferably about 1500 Å.

As shown in FIG. 7, capacitor openings 54 and bit lines 24 40 42 are formed by patterning the oxide layer 50, the polycide layer 42, the polysilicon layer 24, the sidewall spacers 30, and portions of the node plugs 41. The capacitor openings 54 have been formed automatically without using conventional photo patterning processes. The oxide layer 50, the polycide layer 42, the polysilicon layer 24 have second sidewalls 54A that define the capacitor openings 54.

Figure 8:
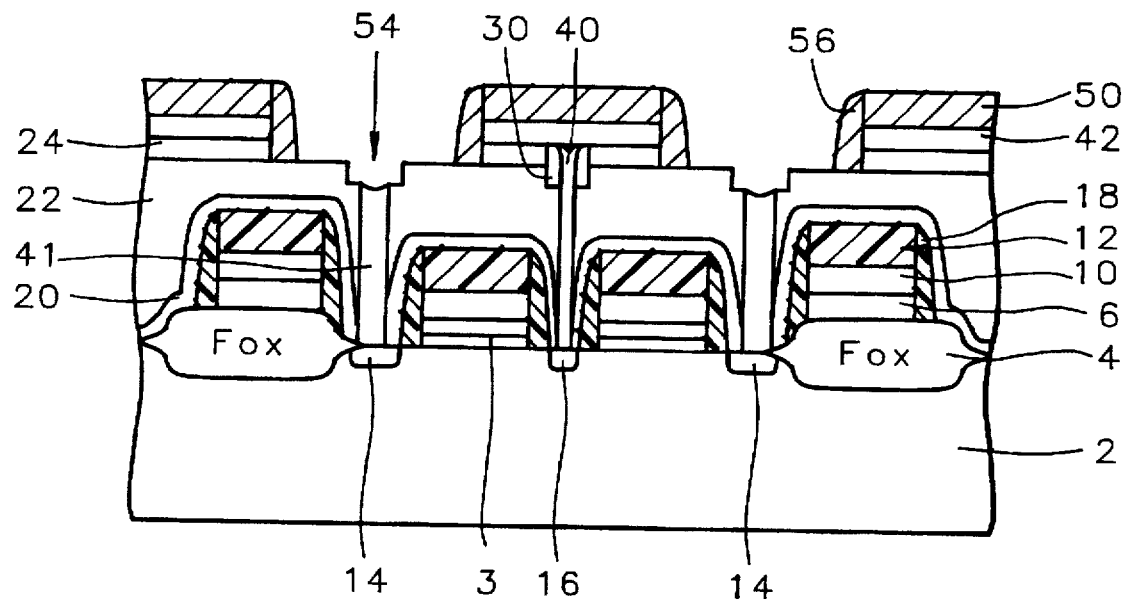

Turning to FIG. 8, second sidewall spacers 56 are formed on the second sidewalls 54A. The second sidewall spacers are preferably formed of silicon oxide or silicon nitride and are more preferably formed of silicon oxide. Silicon oxide sidewall spacers 56 are preferably formed using a TEOS process. The sidewall spacers are formed by depositing a conformal silicon oxide layer (not shown) and etching back the layer. The conformal silicon oxide layer is preferably forming using tetraethylorthosilicate oxide (TEOS) reagent by depositing silicon oxide at 650° to 750° C. in a low pressure chemical vapor deposition reactor.

The second sidewall spacers 56 preferably have a thickness in the range of between about 300 and 1500 Å. The capacitor storage electrode is self aligned to the second spacers. The second spacers provide the electrical isolation between the bitline contact 40 and the capacitor node 41. By combining the bitline contact and node contact holes into a single masking step, the invention eliminates one masking operation thus reducing cost and complexity.

Figure 9:
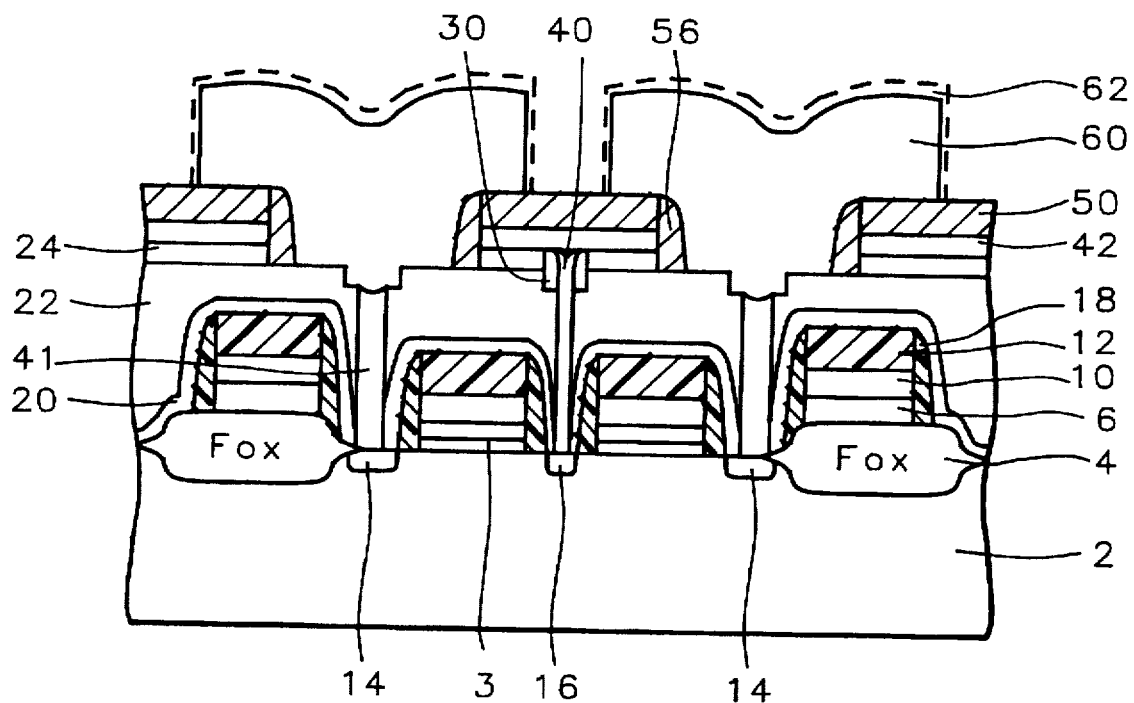
Figure 10:
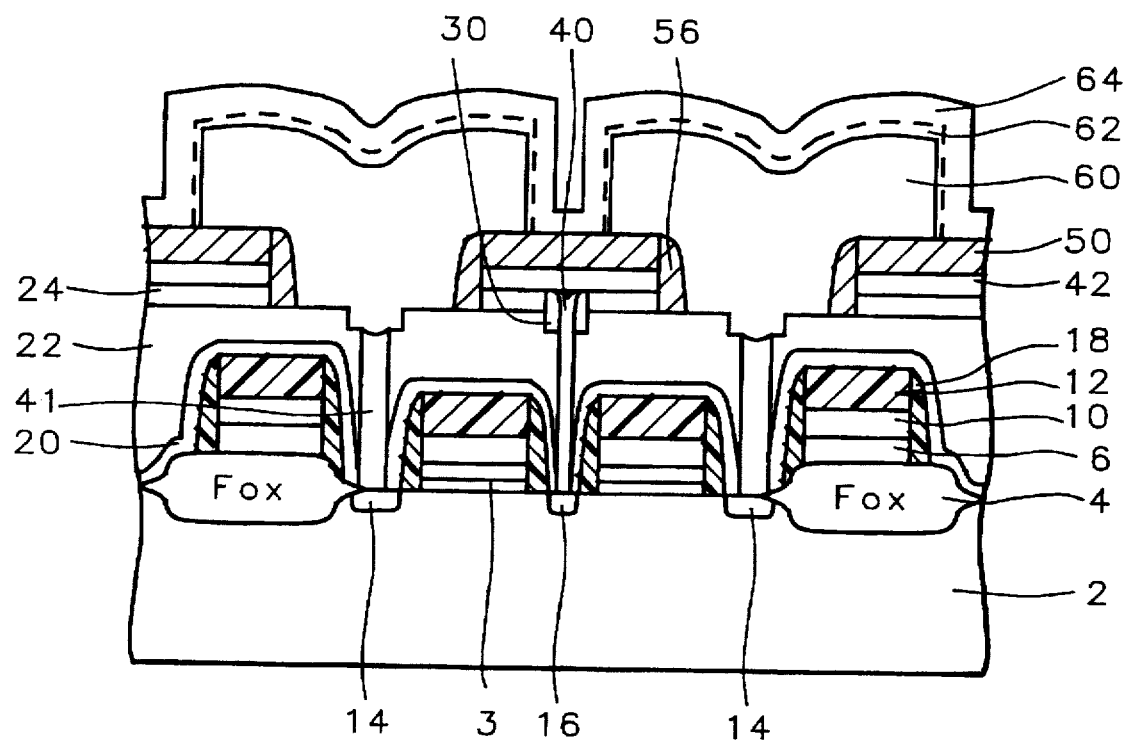

As shown in FIG. 9, an electrode plate (i.e., capacitor storage electrode) 60 is formed filling the first opening 54 and forming a contact to the node plug 41. Thereby first level interconnects 60 41 are formed in the source regions 14. The electrode plate 60 forms the bottom plate (i.e., storage electrode) of a capacitor. The electrode plate 60 is preferably formed of polysilicon, tungsten silicide (WSi) or tungsten (W). The electrode plate preferably has a thickness in the range of between about 2000 and 10,000 Å and more preferably about 7000 Å. The electrode plate is preferably formed of a doped polysilicon or a polycide such as WSi. The electrode plate 60 preferably has an impurity concentration in the range of between about 1E19 and 1E22 atoms/cm$^3$.

As shown in FIG. 9, a capacitor dielectric layer 62 is formed over the electrode plate 60. The material of the dielectric layer 62 can be any suitable materiel having a high dielectric constant and being continuous and pinhole free. The conformal dielectric layer 62 is preferably formed of silicon nitride, an oxide/nitride/oxide (ONO) film, tantalum pentoxide (Ta$_2$O$_5$), or silicon oxide material. Preferably, the conformal dielectric layer is formed of ONO. The conformal dielectric layer 62 preferably has a thickness in the range between about 30 and 100 Å and more preferably about 55 Å. A direct blanket etch back process is preferably used to etch the capacitor dielectric between adjacent electrodes 60.

Next, a top electrode layer 64 is formed over the capacitor dielectric layer 62 thereby forming a capacitor and completing a memory cell. This is accomplished by forming a doped conductive layer over the substrate surface. A polysilicon layer can be formed and doped in situ or alternately ion implanted with impurities to obtain the proper doping level. The top electrode 64 preferably has a thickness in the range between about 500 and 2000 Å and more preferably about 1000 Å. The top plate electrode 64 is preferably formed of polycrystalline silicon doped with an impurity. The top plate electrode/conductive layer can have an impurity concentration in the range of between about 1E19 and 1E22 atoms/cm$^3$ and more preferably about 1E21 atoms/cm$^3$.

Figure 11:
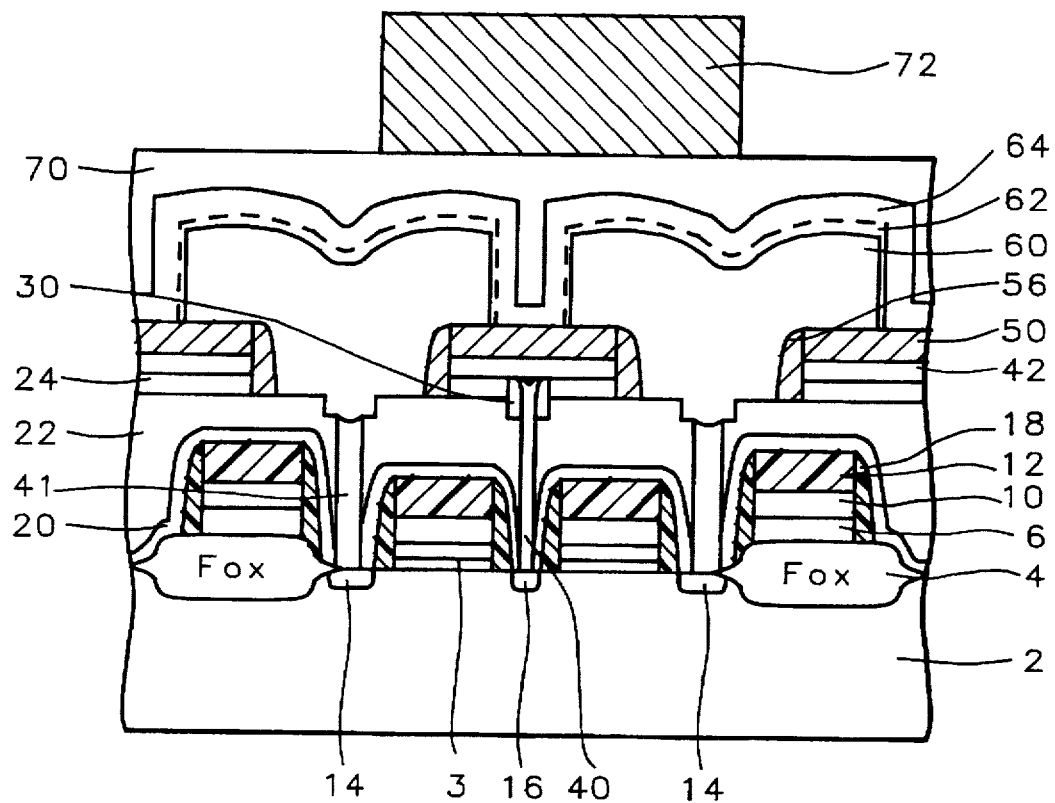

The DRAM cell is completed by forming a top insulation layer 70 and a metal layer 72 over the top electrode as shown in FIG. 11. The top isolation layer has a thickness in the range of between about 1000 and 5500 Å and is composed of borophosphosilicate glass. The metal layer connects various elements together in a circuit.

The present invention provides a novel method of forming an interconnect, capacitor and a miniaturized memory cell which has numerous advantages over the prior art. First, the inventive self-aligning process uses the two sets of spacers 30 56 to form small interconnects 41 40 and storage electrodes 60. The first spacers 30 that define the contact holes 32 34 allow a wide processing overlay window for contact etching to form the contact holes 32 34. Also, the gate sidewall spacers 18 (FIG. 2) permit small contact holes 32 34 with a high aspect ratio (>3). By eliminating planarized oxide layers, a small aspect ratio can be achieved. The invention improves the processing overlay window between the gate lines 6, 10 and contacts 40, 41 by use of the spacers 30.

While the invention has been particularly shown and described with reference to the preferred embodiments thereof, it will be understood by those skilled in the art that various changes in form and details may be made without departing from the spirit and scope of the invention.

What is claimed is:

1. A method of fabricating interconnects and capacitors on a semiconductor substrate having device areas and spaced isolation regions formed therein, comprising the steps of:

a) providing a substrate having transistors in said active areas, said transistors comprising source regions, drain regions, and gate electrodes;

b) forming a conformal oxide layer over a resultant surface from step a;

c) forming an interlevel dielectric layer over said conformal oxide layer;

d) forming a first polysilicon layer over said interlevel dielectric layer;

e) masking and etching said first polysilicon layer and said interlevel dielectric layer forming first openings over said source and drain regions, said first openings defined by first sidewalls of said first polysilicon layer and said interlevel dielectric layer;

f) forming first sidewall spacers on said first sidewalls;

g) forming node contact holes and bitline contact holes by etching said interlevel dielectric layer using said first polysilicon layer and said first sidewall spacers as a mask, said node contact holes exposing said source regions and said bitline contact holes exposing said drain regions;

h) filling said node contact holes with node plugs and filling said bitline contact holes with bitline plugs;

i) forming a polycide layer over said interlevel dielectric layer, said bitline plugs and said node plugs;

j) forming a first oxide layer over said polycide layer;

k) patterning and etching said first oxide layer, said polycide layer, said first polysilicon layer, said first sidewall spacers, and portions of said node plugs forming capacitor openings and bit lines, said capacitor openings defined by second sidewalls of said first oxide layer, said polycide layer, and said first polysilicon layer;

l) forming second sidewall spacers on said second sidewalls; and m) forming an electrode plate filling said first openings and forming an electrical contact to said node plugs thereby forming an interconnect to said source regions.

2. The method of claim 1 which further includes forming a capacitor dielectric layer and a top electrode layer over said electrode plate filling thereby forming a capacitor and completing a memory cell.

3. The method of claim 1 wherein said first sidewall spacers are comprised of polysilicon and said second sidewall spacers are formed of silicon oxide.

4. The method of claim 1 wherein said polycide layer is formed of tungsten silicide.

5. The method of claim 1 wherein said first opening defined by said first sidewalls has a width in a range of between about 0.25 and 0.4 µm.

6. The method of claim 1 wherein said first sidewall spacers have a thickness in a range of between about 500 and 1000 Å.

7. The method of claim 1 wherein said conformal oxide layer has a thickness in a range of between about 500 and 5000 Å.

8. The method of claim 1 wherein said interlevel dielectric layer is formed by depositing silicon oxide with an initial thickness in a range of between about 3000 and 10000 Å and etching back said interlevel dielectric layer and after the etch back said the interlevel dielectric layer having a thickness in a range of between about 0 and 3500 Å.

9. The method of claim 1 wherein said first polysilicon layer has a thickness in a range of between about 1000 and 3000 Å and an impurity concentration in a range of between about 1E19 and 1E21 atoms/cm$^3$.

10. The method of claim 1 wherein said first oxide layer has a thickness in a range of between about 500 and 2000 Å.

11. The method of claim 1 wherein said second sidewall spacers have a thickness in a range of between about 300 and 1500 Å.

12. A method of fabricating interconnects and capacitors on a semiconductor substrate having device areas and spaced isolation regions formed therein, comprising the steps of:

a) forming a gate oxide layer over said substrate;

b) forming a first conductive layer over said gate oxide layer;

c) forming a gate dielectric layer over said first conductive layer, said gate dielectric layer composed of silicon oxide;

d) patterning said gate oxide layer, said first conductive layer and said gate dielectric layer to form spaced gate electrodes over said device areas and conductive structures over said isolation regions;

e) forming a first isolation layer composed of silicon oxide over the substrate surface resulting from step d;

f) anisotropically etching said first isolation layer thereby forming gate sidewall spacers on sidewalls of said gate electrodes and on sidewalls of said conductive structures;

g) implanting impurity ions into said substrate using said gate electrodes and said gate sidewall spacers as a mask forming source regions and drain regions;

h) forming a conformal oxide layer over the resultant surface from step g;

i) forming an interlevel dielectric (ILD) layer over said conformal oxide layer, said interlevel dielectric layer formed of borophosphosilicate glass;

j) forming a first polysilicon layer over said interlevel dielectric (ILD) layer;

k) masking and etching said first polysilicon layer and said interlevel dielectric layer forming first openings over said source and drain regions, said first openings defined by first sidewalls of said first polysilicon layer and said interlevel dielectric layer;

l) forming first sidewall spacers of composed polysilicon on said first sidewalls;

m) forming node contact holes and bitline contact holes by etching said interlevel dielectric layer using said first polysilicon layer and said first sidewall spacers as a mask, said node contact holes exposing said source regions and said bitline contact holes exposing said drain regions;

n) filling said node contact holes with node plugs and filling said bitline contact holes with bitline plugs;

o) forming a tungsten silicide layer over said interlevel dielectric layer, said bitline plugs and said node plugs;

p) forming a first oxide layer over said tungsten silicide layer;

q) patterning and etching said first oxide layer, said tungsten silicide layer, said first polysilicon layer, said first sidewall spacers, and portions of said node plugs forming capacitor openings and bit lines, said capacitor openings defined by second sidewalls of said first oxide layer, said tungsten silicide layer, and said first polysilicon layer;

r) forming second sidewall spacers composed of silicon oxide on said second sidewalls;

s) forming an electrode plate filling said first openings and forming an electrical contact to said node plugs thereby forming an interconnect to said source regions;

t) forming a capacitor dielectric layer and a top electrode layer over said electrode plate thereby forming a capacitor and completing a memory cell.

13. The method of claim 12 wherein a distance between said gate electrodes is in a range of between about 0.25 and 0.4 µm and a distance between said first isolation spacers in a range of between about 0.2 and 0.35 µm.

14. The method of claim 12 wherein said first conductive layer is composed of a bottom polysilicon layer and an upper tungsten silicide layer, said bottom polysilicon layer having a thickness in a range of between about 500 and 1500 Å and said upper tungsten silicide layer having a thickness in a range of between about 500 and 1500 Å.

15. The method of claim 12 wherein said a gate dielectric layer has a thickness in a range of between about 500 and 2000 Å and said gate dielectric layer composed of silicon oxide formed by a process using tetraethylorthosilicate.

16. The method of claim 12 wherein said first gate sidewall spacers have a thickness in a range of between about 200 and 1000 Å and said first isolation layer is formed of silicon oxide by a process using Tetraethylorthosilicate.

17. The method of claim 12 wherein said conformal oxide layer has a thickness in a range of between about 500 and 5000 Å.

18. The method of claim 12 wherein said interlevel dielectric layer is formed by depositing oxide with an initial thickness in a range of between about 3000 and 10000 Å and etching back said interlevel dielectric layer and after the etch back said the interlevel dielectric layer has a thickness in a range of between about 0 and 3500 Å.

19. The method of claim 12 wherein said first polysilicon layer has a thickness in a range of between about 1000 and 3000 Å and an impurity concentration in a range of between about 1E19 and 1E21 atoms/cm$^3$ .

20. The method of claim 12 wherein said first opening defined by said first sidewalls has a width in a range of between about 0.25 and 0.4 µm.

21. The method of claim 12 wherein said first sidewall spacers have a thickness in a range of between about 500 and 1000 Å on said first sidewalls.

22. The method of claim 12 wherein said first oxide layer has a thickness in a range of between about 500 and 2000 Å.

23. The method of claim 12 wherein said second sidewall spacers have a thickness in a range of between about 300 and 1500 Å.

* * * * *